(12) United States Patent
Zanders

(10) Patent No.: US 7,729,193 B2
(45) Date of Patent: Jun. 1, 2010

(54) BACKUP FOR VOLATILE STATE RETENTION IN THE ABSENCE OF PRIMARY CIRCUIT POWER

(75) Inventor: Gary V. Zanders, Fairview, TX (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 111 days.

(21) Appl. No.: 12/188,622

(22) Filed: Aug. 8, 2008

(65) Prior Publication Data

US 2009/0040859 A1 Feb. 12, 2009

Related U.S. Application Data

(60) Provisional application No. 60/955,312, filed on Aug. 10, 2007.

(51) Int. Cl.
*G11C 5/14* (2006.01)
(52) U.S. Cl. .................. 365/229; 365/228; 365/185.08
(58) Field of Classification Search .................. 365/226, 365/228, 229, 233.1, 185.08, 189.07, 189.09
See application file for complete search history.

(56) References Cited

U.S. PATENT DOCUMENTS

| 5,986,962 | A  | * | 11/1999 | Bertin et al. | ................. 365/228 |
| 6,097,243 | A  | * | 8/2000  | Bertin et al. | ................. 327/544 |
| 6,345,362 | B1 | * | 2/2002  | Bertin et al. | ................. 713/300 |
| 7,394,687 | B2 | * | 7/2008  | Bertin et al. | ........... 365/185.08 |
| 2009/0039708 | A1 | * | 2/2009 | Zanders | ....................... 307/70 |

* cited by examiner

*Primary Examiner*—Gene N. Auduong
(74) *Attorney, Agent, or Firm*—North Weber & Baugh LLP

(57) ABSTRACT

A backup volatile state retention circuit is provided with low leakage current for employment with a volatile memory circuit to store the value of the latter during power down of the volatile circuit or during power-down or inactivation of neighboring or peripheral circuits or due to the loss of power of any of these circuits. An example of such a volatile circuit is a memory circuit having volatile memory cells such as employed in dynamic memory core, in particular, a random access memory (RAM) in CMOS circuitry.

34 Claims, 3 Drawing Sheets

BACKUP FOR VOLATILE STATE RETENTION IN THE ABSENCE OF PRIMARY CIRCUIT POWER

RELATED PATENT APPLICATIONS

This application claims priority to U.S. provisional application Ser. No. 60/955,312, entitled "Digital Circuit State Retention", filed Aug. 10, 2007, which application is incorporated herein by reference in its entirety. This application is related to patent application, Ser. No. 12/188,694, filed on Aug. 8, 2008 and entitled, "Backup System for Circuits Having Volatile States", and is incorporated here in its entirety by its reference.

BACKGROUND

A. Technical Field

The present invention relates generally to digital circuit design, and more particularly, to the design of volatile circuits that contain volatile data states that may be lost without the continued application of applied power. An example of such a volatile circuits are digital memory circuits capable of retaining the data state of each memory cell during power-down periods in which the primary power source for the memory circuit is uncoupled from the memory circuit or, otherwise, interrupted or rendered inactive to the memory circuit. A particular example of such a memory circuit is a random access memory (RAM) circuit.

B. Background of the Invention

An ongoing trend to reduce the size of the components in integrated memory circuits is leading to geometries that enable the operation of memory circuits using a lowered power level of about 1.8 volts. Power at this level is typically provided from a conventional unregulated external power source of about 3.0 volt by an internal low drop out (hereinafter "LDO") power supply regulator. Nonetheless, when such low voltage devices are inactivated or turned off, such as for backup or standby, the leakage currents exhibited are substantially large compared to those in devices configured using earlier versions of CMOS technology that typically operate from an unregulated external power source of about 3.0 volts with lower leakage current.

In modern CMOS processes, adequately low standby currents cannot be achieved simply by making all circuit nodes in such a circuit design static because of excessive leakage currents in such smaller geometry devices when placed in an "off" or inactive state. Previous solutions to this problem have concentrated on employing analog circuit techniques to reduce such leakage current. Examples of these techniques are the employment, for example, of a reverse substrate bias and the interposition of much less leaky high voltage transistors in each leakage path, such as employing thicker gate oxide, deeper device junctions and the employment of larger dimension devices or transistor elements. These solutions are complex and do not guarantee the desired results.

What is needed is a way to provide for memory circuit backup of their volatile memory states of the newer lower voltage operating CMOS circuits using an approach that provides for lower leakage during periods of circuit power inactivation or turn-off. The approach here utilizes digital circuit state retention in the absence of circuit power.

SUMMARY OF THE INVENTION

A novel digital approach is employed to achieve low leakage current based upon two principles. First, primary power is turned off to any circuitry that is not critical to the maintenance of circuit volatile states in a low power mode. Second, employ the least leaky circuitry for circuitry that must remain in a powered-up mode such as supplied from a secondary power source. This may be accomplished in one embodiment by the employment of larger geometry CMOS circuitry, for example, that are of higher voltage operation, compared to smaller current CMOS geometry with higher current leakage when in off condition. These older circuits have lower current leakage. Operating at higher voltages, such integrated or embedded circuits must be isolated from lower operating voltage circuits. A specific example is that current faster and smaller geometry CMOS devices or elements, such as 1.8 volt low voltage transistors, exhibit about one hundred times more current leakage per unit device width than larger and slower operating 3.3 volt high voltage transistors.

Thus, according to this invention, a backup state retention circuit is included during power-down or inactivation of circuits that include circuit elements having volatile states, such as those in newer CMOS circuitry. For example, newer CMOS geometry circuitry has lower voltage retention of volatile states accompanied with higher leakage current conditions during primary power source inactivation of these circuits containing such lower voltage circuit devices or elements. These states are preserved during such circuit inactivation with backup state retention circuits that contain circuitry providing for much lower current leakage and, consequently, better state retention during periods of inactivation of the primary power source.

In a digital circuit design that is defined by Register Transfer Level (RTL) description, it is possible to control the implementation of a design to limit itself to only a few specific logic memory element types by coding style and library choices. The circuit storage elements in the embodiments disclosed here are chosen by synthesis tool to a standard cell-based memory core, such as, for example, the type found in MAXQ2010 integrated microcontroller, manufactured by Maxim Integrated Products of Sunnyvale, Calif. An example of such memory elements are a few special purpose flip flop circuits which can be RTL described for both the backup and memory core circuits which are capable of retaining all information necessary to describe the states. Thus, all of the flip flop circuits in such a design contain all the state information necessary to fully describe the memory core, making it possible to provide a backup copy of each flip flop circuit or cell and employ those backup circuits as temporary low leak current storage elements in proximity to the main memory core circuits and their cells while the memory core circuit is in a power-down state or inactivated, such as during backup or standby modes of operation. In this manner, the minimally required volatile state information can be safely retained while powering down of all other circuitry including the on-chip memory core peripheral circuitry.

BRIEF DESCRIPTION OF THE DRAWINGS

Reference will be made to an exemplary embodiment of the present invention that is illustrated in the accompanying figures. Those figures are intended to be illustrative, rather than limiting. Although the present invention is generally described in the context of that embodiment, it is not intended by so doing to limit the scope of the present invention to the particular embodiment thereof depicted and described.

DETAILED DESCRIPTION OF THE PREFERRED EMBODIMENTS

In the following description, for purpose of explanation, specific details are set forth in order to provide an understanding of the present invention. The present invention may, however, be practiced without some or all of these details. The embodiment of the present invention described below may be incorporated into a number of different electrical components, circuits, devices, and systems. Structures and devices shown in block diagram are illustrative of exemplary embodiments of the present invention and are not to be used as a pretext by which to obscure broad teachings of the present invention. Connections between components within the figures are not intended to be limited to direct connections. Rather, connections between components may be modified, re-formatted, or otherwise changed by intermediary components.

Reference in the specification to "one embodiment" or to "an embodiment" means that a particular feature, structure, characteristic, or function described in connection with the embodiment is included in at least one embodiment of the present invention. The use of the phrase "in one embodiment" in various places in the specification does not necessarily constitute plural references to a single embodiment.

According to one aspect of this disclosure, digital circuit state retention, in the absence of power, utilizes an approach that is exclusively digital circuit operation. The approach adheres to two guiding principles. First, in low power mode, power is turned off to any circuit element in the on-chip digital circuit that is not critical to the maintenance of a current volatile data state. Second, the least leaky circuitry available is employed for the circuit elements that remain powered up to maintain the current or pre-existing data state of the power-down memory cells. In one example embodiment, this necessitates the use of large, high voltage transistors. For example, small and fast devices that operate at 1.8 volts nonetheless exhibit about 100 times more leakage current per unit width than do large but slow high voltage transistors that operate at 3.3 volts.

The flip-flop circuits in such a design house all of the data state information necessary to fully describe the core. Therefore, a low leakage current backup copy of each flip-flop circuit is included in the overall volatile circuit design. Then, whenever the core is powered down, it is possible to temporarily preserve the data state information from each flip-flop circuit in a corresponding low leakage current storage location. The principles of the present invention serve to successfully preserve at minimal charge loss all defining data state information whenever other circuitry, approximate, for example, to the volatile circuit memory circuit cells, is powered down or inactivated, such as peripheral circuits that address or read/write from and to a memory core.

Figure 1:
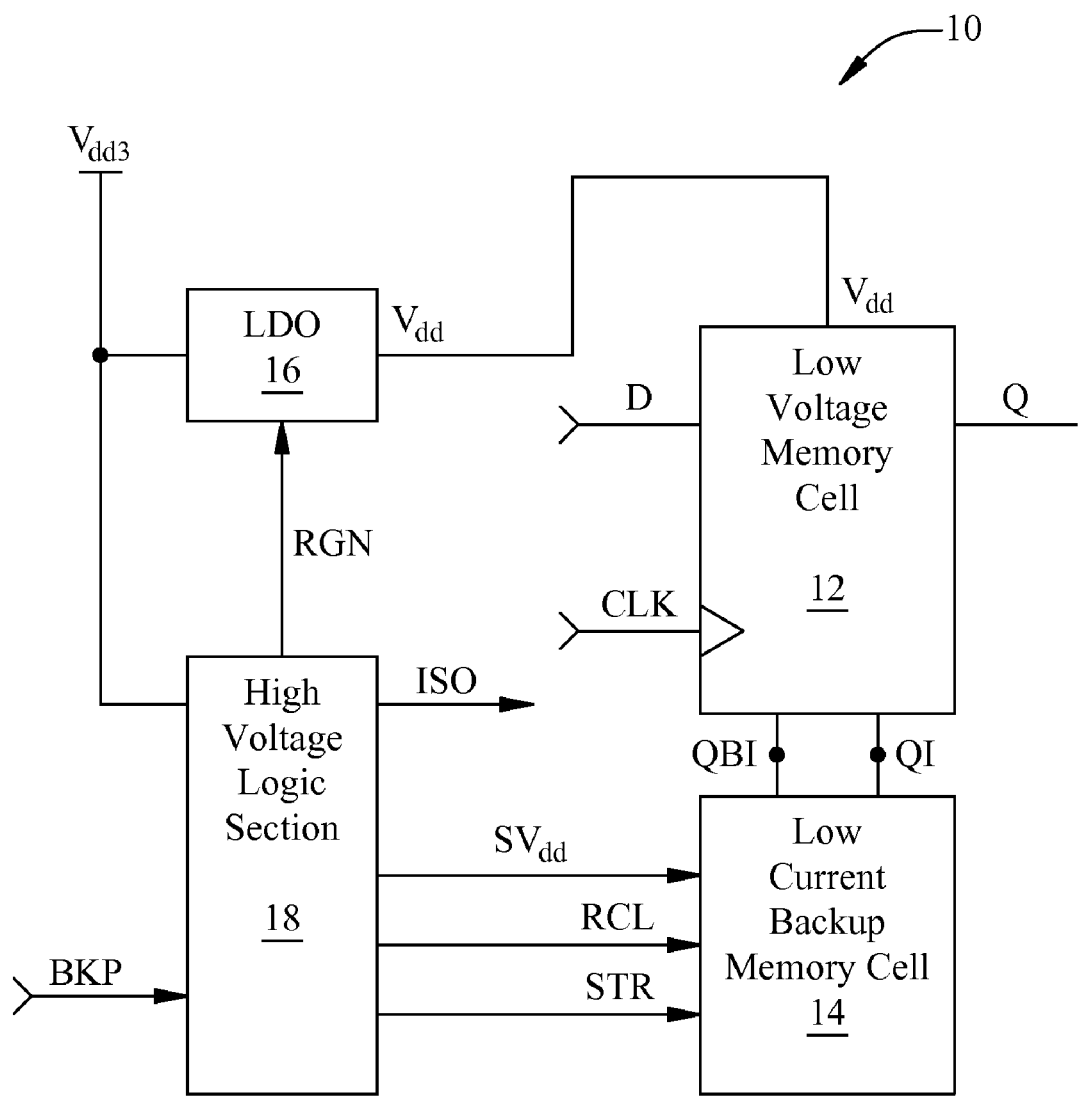
FIG. 1 is a block diagram of a memory circuit that includes a low voltage memory cell and one embodiment of an associated low leakage current backup memory cell according to this invention.

FIG. 1 depicts a typical data storage system that has a single, external, unregulated high voltage power supply, $V_{dd3}$, and that generates a primary regulated low voltage power supply, $V_{dd}$, via an on-chip low drop out (LDO) regulator 16, for providing low voltage power to memory cell circuit 12. Circuit 12 retains bi-stable memory states and constitutes one memory cell for a memory core. Logic circuitry, such as backup memory circuit 14 and logic circuit section 18, are necessary for controlling backup operation of the system and are, therefore, the backup volatile state retention circuit, are fabricated with high voltage circuitry that is driven essentially by the external, unregulated high voltage power supply ($V_{dd3}$). They provide backup volatile state retention for another state retention circuit, such as memory cell circuit 12. This high voltage logic circuitry may remain powered at all times and thereby enables a vast majority of the system circuits to be powered down by turning off low voltage, $V_{dd}$, at on-chip LDO regulator 16.

The memory circuit 10 showed in FIG. 1 includes a low voltage memory cell 12, such as, for example a flip flop circuit, and an embodiment of an associated low leakage current backup memory cell 14 that together and individually incorporate teachings of this invention. Low voltage memory cell 12 may be, as an example of one embodiment, a clocked D flip-flop circuit that in response to an input signal D produces an output signal Q. The backup state retention circuit cell 14 may be, for example, a SRAM cell. The temporal functioning of state retention circuit comprising memory cell 12 is coordinated with other elements of memory circuit 10 by a system clock signal CLK.

It should be understood that any memory cell can serve as a backup state retention circuit 14 to perform the backup function for memory cell 12. However, some backup memory elements are better than others in terms of size or lower current leakage or preferably both. An SRAM cell is an example of one type of circuit through design can offer both of these attributes. But other memory elements can also perform the function of a backup state retention circuit. In choosing the least current leakage circuit available that must remain in activated during state retention backup, this may include circuits that contain high voltage circuit elements. In one embodiment to be explained below, such high voltage elements may be high voltage MOSFET transistors which may be smaller size with low leakage current. However, there are MOSFETS available depending upon the processes used that are designed specifically for low leakage current and are not high voltage transistors. Thus, the point is that the attributes to be achieved in the back state retention circuit is the use of small size circuitry with the least current leakage.

Memory circuit 10 may be formed as a conventional MOSFET circuit and receives power from a conventional, unregulated external power source at an input voltage $V_{dd3}$, which is typically somewhat in excess of about 3.0 volts, e.g., 3±10% volts. Input voltage $V_{dd3}$ is applied firstly to internal LDO power supply regulator 16, which produces as an output an internally-regulated low voltage $V_{dd}$ of about 1.8 volts. These high and voltage levels provided from the power sources can be other voltage level combination values as is known in the art and the chosen voltage levels are optimized for different design processes and rules.

Internally-regulated low voltage $V_{dd}$ is the power supplied to low voltage memory cell 12. Input voltage $V_{dd3}$ is also applied to high voltage logic section 18 of memory circuit 10. Among other functions, high voltage logic section 18 produces as an output an unregulated high voltage $SV_{dd}$ that provides the power for low leakage current backup memory cell 14 during the period of time of other circuits in the chip are power-down or inactivated.

Responsive to the presence or absence of an input backup signal BKP from elsewhere in memory circuit 10 or system circuits, high voltage logic section 18 manages the functioning relationships among the other elements of memory circuit 10 that are included in FIG. 1. High voltage logic section 18 does so through a variety of output signals, a select few of which are shown in FIG. 1, the rest of which are not necessary to the explanation of this invention. These include a regulator enable signal RGN that is communicated as an input to internal LDO power supply regulator 16, an isolate signal ISO, and pair of signals that are supplied on particular occasions, such as, for example, during backup or standby mode of operation, to operate low leakage current backup memory cell 14. This pair of signals comprises a store signal STR and a recall signal RCL. Responsive to appropriate of these output signals from high voltage logic section 18, low voltage memory cell 12 and low leakage current backup memory cell 14 exchange information in the form of a stored volatile digital data state through an internal node QI and a complementary internal node QBI.

Memory circuit 10 is configured so as to minimize the electrical charge consumed as leakage current during any period in which low voltage memory cell 12 is powered down or inactivated, and the volatile data state in low voltage memory cell 12 is to be preserved. All elements or components concerned with the preservation of the volatile data state in low voltage memory cell 12 are localized in a single isolated region of the semiconductor chip that bears memory circuit 10, and all of those elements are high voltage components that exhibit low leakage current. Low leakage current backup memory cell 14 is a particular example of such an isolated circuit region of high voltage elements or components.

Figure 2:
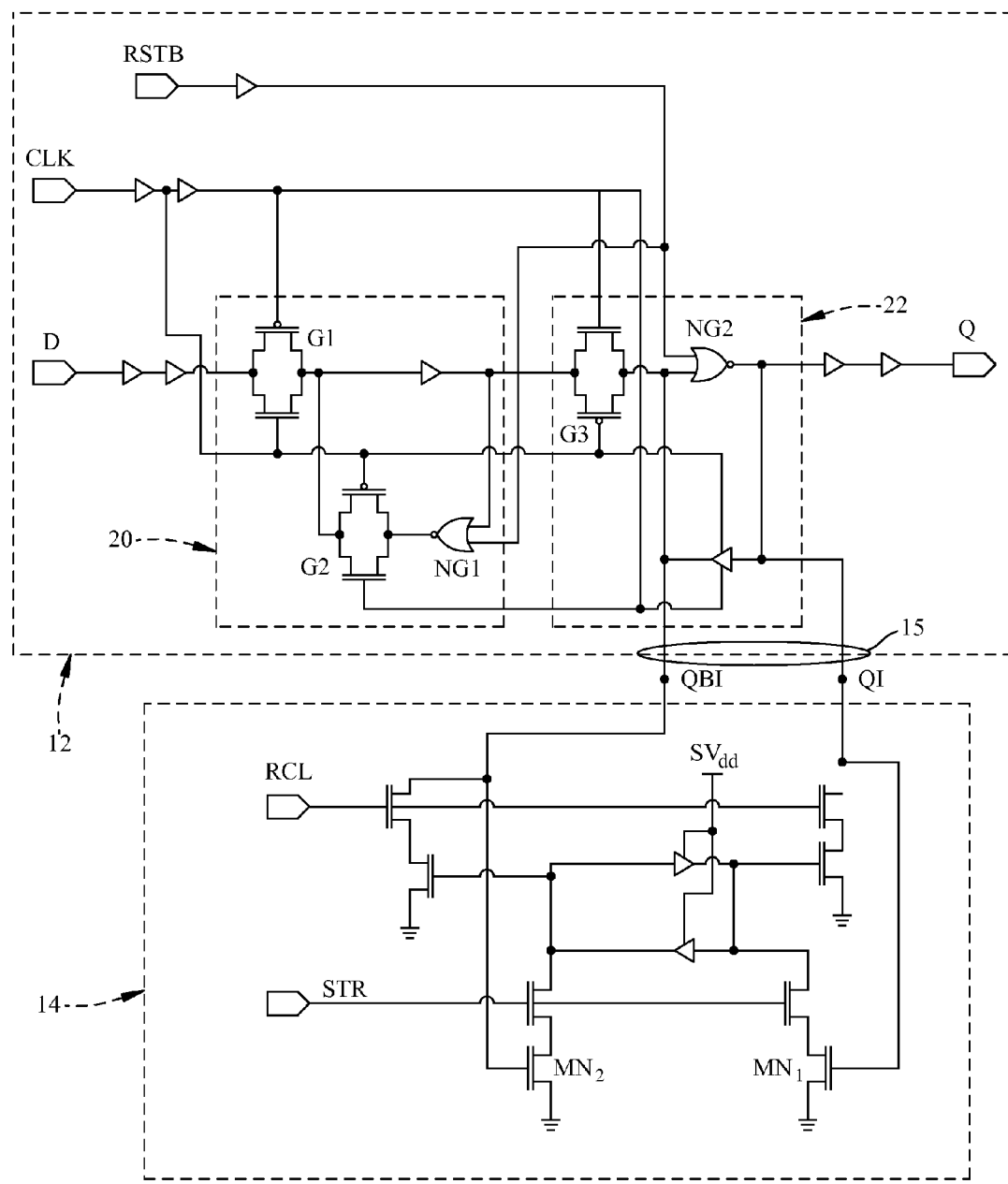
FIG. 2 is a detailed schematic circuit diagram of the low voltage memory cell and the associated low leakage current backup memory cell of FIG. 1.

FIG. 2 includes a detailed schematic diagram of low voltage memory cell 12 and the low leakage current backup memory cell 14 associated therewith.

In the interest of clarity, the supply of regulated low voltage $V_{dd}$ to low voltage memory cell 12 shown in FIG. 1 has been omitted from FIG. 2. All transistors in low voltage memory cell 12 operate at 1.8 volts.

An exemplary embodiment of low voltage memory cell 12 in FIG. 2 includes a master cell section 20 containing a first transmission gate G1, a second transmission gate G2, and a first NOR gate NG1 interconnected as shown with and through various inverters to receive input signal D, system clock signal CLK, and an active low signal RSTB which is a rest signal for the flip-flop circuit 12.

Low voltage memory cell 12 also includes a slave cell section 22 that is provided directly from outside of low voltage memory cell 12 with system clock signal CLK and active low reset signal RSTB. Output signal Q from low voltage memory cell 12 is the internal state of slave section 22. Information about the data state of memory cell 12 via slave section 22 is also accessible at internal node QI and complementary internal node QBI. Slave section 22 includes a third transmission gate G3 and a second NOR gate NG2 interconnected as shown with and through various inverters to master cell section 20 via transistor gate from which slave cell section 22 receives additional input signals.

Also shown in FIG. 2 is an exemplary embodiment of low leakage current backup memory cell 14 configured according to this invention to preserve the volatile data state in low voltage memory cell 12, whenever low voltage memory cell 12 is to be placed in an inactivated condition. Included in low leakage current backup memory cell 14 are a plurality of high voltage inverters and high voltage NMOS transistors with their high impedance gates interconnected, as shown, for communication with slave cell section 22 in low voltage memory cell 12 via internal node QI and complementary internal node QBI. Low leakage current backup memory cell 14 receives a store signal STR and a recall signal RCL from high voltage logic section 18 of memory circuit 10, as seen in FIG. 1 and is powered by unregulated high voltage $SV_{dd}$ from that same source.

As shown in FIG. 2, low leakage current backup memory cell 14 functions as a backup RAM cell that may comprise a single flip-flop circuit cell in memory circuit 10 and is constructed of high voltage elements or components integrated in the same semiconductor chip as memory circuit 10 and, thus, integrated along with low voltage components comprising main memory cell 12. Prior to powering down or inactivation of low voltage memory cell 12, the volatile data state stored in cell 12 is transferred for storage into low leakage current backup memory cell 14 via interconnection path 15. To power up again, the data state stored in low leakages backup memory cell 14 is transferred back via path 15 into low voltage memory cell 12 so that the normal operation of memory circuit 10 can proceed.

Under power-down or inactivated conditions, low leakage backup memory cell 14 is supplied with power through high voltage logic section 18 from input voltage $V_{dd3}$. Advantageously at such times, internal LDO power supply regulator 16 is disenabled, via signal RGN, from providing any power to memory cell 12 since it is no longer necessary and, therefore, can be turned off. This disenabling of power provides a substantial savings in current consumption during such inactivation periods. Thus, the regulated power supply via LDO 16 to the main memory core of flip flop memory cells 12 is removed while backup RAM cell 14 is holding the cell 12 content to save primary circuit power. In this case too, store signal STR and recall signal RCL, which are both high voltage signals ($V_{dd3}$ and $SV_{dd}$), such as 3 v, as an example, can directly control high voltage memory cell 14 in the absence of regulated low voltage supply via LDO regulator 16.

Thus, even in the absence of any supply of internally regulated low voltage $V_{dd}$, it is possible to operate low leakage current backup memory cell 14 at will or even continually to retain its stored state. However, in the presence of internally regulated low voltage $V_{dd}$, taking store signal STR high in memory cell 14 allows the contents of the flip-flop circuit in low voltage memory cell 12 to be loaded into the backup memory cell 14, via QBI and QI inputs in path 15 between cells 12 and 14. On the other hand, taking recall signal RCL low moves data, via path 15 between cells 12 and 14 back from the backup memory cell in low leakage current backup memory cell 14 back into the flip-flop circuit of low voltage memory cell 12.

Of course, because of the employment of high voltage nature of high voltage supply $SV_{dd}$, store signal STR, and recall signal RCL, backup memory cell 14 is fabricated of higher high voltage operating elements or components which provides the additional advantage for the use of low leak current elements implemented in the data state backup mode of operation via circuit 14.

From the foregoing description, it can be seen that the circuit configuration of FIGS. 1 and 2 offer several significant advantages. First, there is no low impedance path exists between the flip-flop circuit of low voltage memory cell 12 and the backup memory cell in low leakage current backup memory cell 14. Instead, low voltage memory cell 12 and low leakage current backup memory cell 14 are isolated from each other by the high impedance gates of high voltage NMOS transistors. In the embodiment illustrated in FIG. 2, these take transistors are first high voltage transistor $MN_1$ with its gate coupled to internal node QI in path 15 of slave cell section 22 of low voltage memory cell 12, and a second high voltage transistor MN2 with its gate coupled to complementary internal node QBI in path 15 of slave cell section 22.

As a result, different power levels of activity in either low voltage memory cell 12 or in low leakage current backup memory cell 14 cannot directly affect the other. This precaution prevents inadvertent corruption of the volatile memory data state in either low voltage memory cell 12 or in low leakage current backup memory cell 14 while the states of either circuit are being read by the other circuit.

Second, no high voltage transistors are interposed in speed path 15 in the arrangement of FIG. 2 since there are no impedance elements in path 15 other than the path itself. Therefore, the only effect on memory circuit performance arising from low leakage current backup memory cell 14 is a slight additional capacitance that can arise at internal node QI and complementary internal node QBI of the flip-flop circuit interconnection of circuits 12 and 14.

Finally, due to proper system design of the circuit embodiment of FIG. 2, only the data state of half of flip flop memory circuit 12 need be saved which minimizes the current consumed while in the inactivation state or condition. In particular, only the data state in slave cell section 22 need be preserved in low leakage current backup memory cell 14 during power-down or inactivation conditions which minimizes the total amount of current that must be consumed by backup circuit cell 14 during a backup mode of operation. In other words, only one state of main memory cell 12 is required to be backed up for storage in backup cell 14 so that less circuitry is required for the backup circuit (i.e., none necessary for backing up the other data state in cell at master cell section 20), resulting in lower power consumption during the backup mode of operation. This serves to reduce nearly by half the amount of charged consumed as leakage current while memory circuit 10 is operated in a backup or standby mode of operation.

It can be realized from the description thus far that during a second (backup, standby, etc.) mode of operation, a significant amount of reduction in circuit power consumption is achieved by: (1) the turn off of LDO regulator 16, (2) reduction in the amount of circuitry required for backup state retention circuit 14 to preserve the volatile state of state retention circuit cell 12, and (3) the deployment of circuit elements for backup state retention circuit 14 that provided lower current leakage.

As a rule, clock signal CLK must always be in the same state when storing a data state from low voltage memory cell 12 to backup memory cell 14 as well as when recalling the data state from backup memory cell 14 to low voltage memory cell 12 via speed path 15 between these circuit cells. Thus, if slave section 22 is the circuit cell section that is to be backed up, the volatile state of this section must be stored and recalled, relative to backup circuit 14, during static clock (CLK) logic low or 0. By the same token, if master section 20 is the circuit cell section that is to be backed up, the volatile state of this section must be stored and recalled, relative to backup circuit 14, during static clock (CLK) logic high or 1. Also, correspondingly, the flip-flop circuit of low voltage memory cell 12 must be structured in a manner that is appropriate to the voltage levels chosen for use with clock signal CLK.

In the embodiment shown in FIG. 2, flip flop circuit 12 requires a clock signal CLK to operate at logic 0 when either a store STD or a recall RCL function are being performed. This is because the transmission gates G1 and G2 between master cell section 20 and slave cell section 22 will be in an OFF or logic 0 state during store and recall functions so that the store and recall function for slave cell section 22 will not have to contend with or be responsive to the state condition existing at master cell section 20.

As another embodiment, if the flip flop of memory circuit 12 is designed to operate relative to a state change with logic 1 of clock signal, CLK, then the state of master cell section 20 cannot be ignored and also be saved in backup circuit 14. In order to accomplish such a master cell store and recall function in backup memory circuit 14, a second high voltage circuit, the same as or similar to circuit 14 in FIG. 2, will be required in the high voltage circuitry with direct connection to master cell circuit 20 to store its value and permit the stored state recall when low voltage memory cell is to be reactivated.

Figure 3:
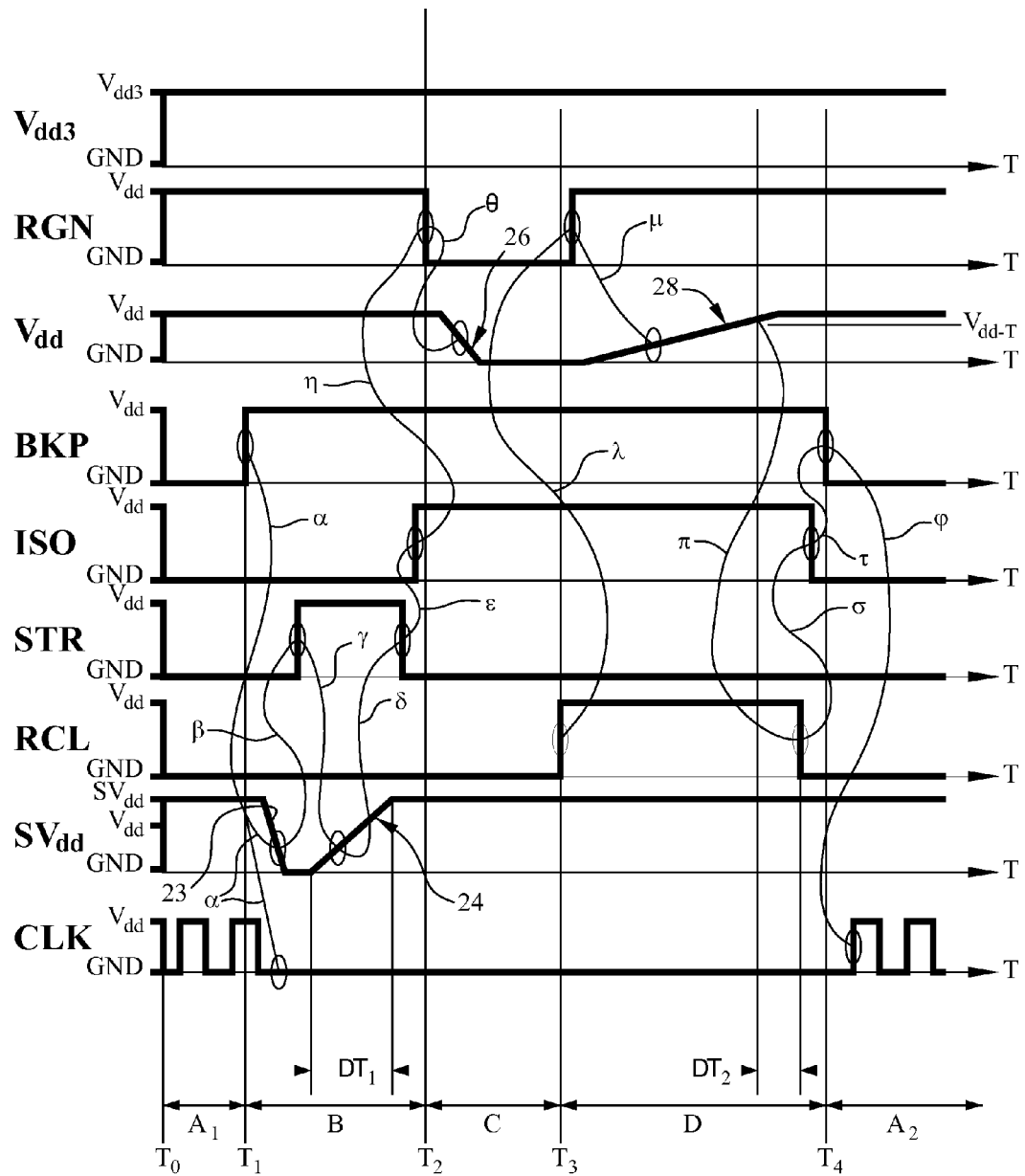
FIG. 3 is a diagram of waveforms that illustrate the operation of the low voltage memory cell and the associated low leakage current backup memory cell of FIG. 2 according to this invention.

FIG. 3 is a logic signal diagram that illustrates sequences of various events that occur during the operation of memory circuit 10 in FIG. 1 according to this invention. FIG. 3 includes a plurality of waveforms that appear over time at various locations in memory circuit 10 as memory circuit 10 shifts into and out of a power-down or inactivated, backup mode of operation where the supply of internally regulated low voltage $V_{dd}$, provided to low voltage memory cell 12, is terminated. The volatile data state found in slave cell section 22 of low voltage memory cell 12 is preserved with minimal charge loss in low leakage current backup memory cell 14.

Each of the several waveforms in FIG. 3 includes a horizontal axis of changing time, T that progresses horizontally to the right in the figure and a vertical axis of voltage that increases vertical in the figure from a ground state GND that corresponds to logic 0. The waveforms are aligned according to time T wherein, at any specific moment during the illustrated operation of memory circuit 10, the simultaneous condition of each of the waveforms is aligned vertically. Therefore, these waveforms depict the operation of memory circuit 10 during an initial normal mode of operation $A_1$, during a backup mode of operation C, and thereafter during a resumed normal mode of operation $A_2$. In the transition from initial normal mode of operation $A_1$ to backup mode of operation C, memory circuit 10 operates in a backup-entry mode of operation B. Similarly, during the transition from backup mode of operation C to resumed normal mode of operation $A_2$, memory circuit 10 operates in a backup-exit mode of operation D.

At the topmost position in FIG. 3 is a waveform for input high voltage, $V_{dd3}$ that is presented without interruption during the periods of normal (first) mode of operation and is provided to both internal LDO power supply regulator 16 and high voltage logic section 18 of memory circuit 10 as seen in FIG. 1. Below that waveform is a waveform for regulator enable signal RGN that is presented at an appropriate time from high voltage logic section 18 to internal LDO power supply regulator 16. Next, below that waveform is a waveform for internally regulated low voltage $V_{dd}$ that is supplied by internal LDO power supply regulator 16 to low voltage memory cell 12 during all periods of the normal operation of memory circuit 10, i.e., when regulator circuit 16 is enabled by signal RGN.

In sequential order, below the above mentioned waveforms in FIG. 3, there is a waveform for backup signal BKP that is received at high voltage logic section 18 from elsewhere in memory circuit 10. Backup signal BKP initiates the process of preserving the data state in low voltage memory cell 12 while the power supply to memory cell 12, via internally regulated low voltage $V_{dd}$, is terminated during, or close to, or at the end of the backup-exit mode of operation D. Next, in descending sequence, is a waveform for isolate signal ISO. Isolate signal ISO is generated in high voltage logic section 18 and employed in portions of memory circuit 10 during the entirety of backup-exit mode of operation D. The ISO signal prevents any possibility of addressing the memory cells (such as memory circuit 12 in a memory core of such cells) by peripheral circuits, such as row and column address circuits. This isolation is activated substantially during the backup or standby (second) mode of operation C and D. This isolation function is also explained in a companion patent application, Ser. No. 12/188,694, supra.

Below signal ISO in FIG. 3 are pair of related waveforms that allow high voltage logic section 18 to operate low leakage current backup memory cell 14 as required by memory circuit 10. The first, or upper, of these related waveforms is a waveform for store signal STR. Store signal STR is sent from high voltage logic section 18 to low leakage current backup memory cell 14 to cause low leakage current backup memory cell 14 to commence a read operation of the current volatile data state of slave cell section 22 in low voltage memory cell 12 for backup in high voltage memory cell 14. The second, or lower, of these related waveforms is a waveform for recall signal RCL. Recall signal RCL also sent from high voltage logic section 18 to low leakage current backup memory cell 14, but, contrastingly, permits low leakage current backup memory cell 14 to provide its current memory state to be read by low voltage memory cell 12.

Finally, the waveforms of FIG. 3 conclude at the bottom thereof with a waveform for unregulated input high voltage $SV_{dd}$ that is produced by high voltage logic section 18 to power low leakage current backup memory cell 14, and below that with a waveform for system clock signal CLK.

Normal operation of memory circuit 10 in both initial normal mode of operation $A_1$ and in resumed normal mode of operation $A_2$ coincides with the running of the clock of memory circuit 10 and the appearance of system clock signal CLK at low voltage memory cell 12. To prevent any possible latchup, unregulated high voltage $SV_{dd}$ is maintained in the active state, not only during backup mode of operation C and backup-exit mode of operation D, but also during normal operation in both initial normal mode of operation $A_1$ and in resumed normal mode of operation $A_2$.

At a time $T_1$, at the conclusion of initial normal mode of operation $A_1$, the process of shifting memory circuit 10 into backup mode of operation C commences. Accordingly, backup-entry mode of operation B commences at $T_1$ and backup signal BKP is asserted, requesting that the data state in the flip-flop circuit in low voltage memory cell 12 be mapped into the backup memory cell in low leakage current backup memory cell 14. In response, and as indicated in FIG. 3 by double-headed arrow α, a pair of events occur. First, clock signal CLK ceases operation or is not provided to memory cell 12 and, further, remains in a logic 0 state during the entirety of the subsequent backup mode of operation C, as seen on the examination of waveform CLK in FIG. 3. Second, the supply of unregulated high voltage $SV_{dd}$ to low leakage current backup memory cell 14 is powered down, as indicated by downward descending waveform at 23 and is briefly terminated as indicated at waveform $SV_{dd}$ in operational mode B.

This latter event occurs before any store signal STR is asserted by high voltage logic section 18. The temporary termination of the supply of unregulated high voltage $SV_{dd}$ to low leakage current backup memory cell 14 allows a correct data state to be brought into low leakage current backup memory cell 14 during the time that low leakage current backup memory cell 14 is being powered on or in active operation via $SV_{dd}$. Thus, there is no need to have the memory cell of low leakage current backup memory cell 14 be overdriven in order to change any preexisting date state present in the memory cell. In this manner, any large current spike can be avoided from accompanying unregulated high voltage $SV_{dd}$.

Next, as indicated by an arrow β in FIG. 3, store signal STR is asserted by high voltage logic section 18. In response thereto, and as indicated by arrow γ, the supply of unregulated high voltage $SV_{dd}$ increases to its previous level from logic 0 or low to logic 1 or high along an ascending waveform indicated at 24 over a recovery period of about $\Delta T_1 \geq 5.0$ μsec. The memory cell in low leakage current backup memory cell 14 assumes a data state that corresponds to the data state in the flip-flop circuit in slave section 22 of low leakage current backup memory cell 14. In other words, the data state that is to be preserved in low leakage current backup memory cell 14 for the duration of forthcoming backup mode of operation C is set into memory cell 14 and prevents operation of its peripheral circuits as previously discussed. As indicated by an arrow δ, store signal STR is thereafter deasserted, and isolate signal ISO goes high or logic 1 ($V_{dd}$), as indicated by an arrow ε. This latter event provides an indication in memory circuit 10 that the store process has been completed in backup memory cell at circuit 14.

Next, as indicted by an arrow η at time $T_2$, regulator enable signal RGN goes low to logic 0. As indicated by an arrow θ, this disables internal LDO power supply regulator 16, which causes the application of internally regulated low voltage $V_{dd}$ to diminish toward ground state GND as indicated by descending waveform at 26. Eventually, the supply of internally regulated low voltage $V_{dd}$ to the flip-flop circuit in low voltage memory cell 12 ceases and, thus, low voltage memory cell 12 is no longer active so that no further losses of charge occur from the flip-flop circuit in low voltage memory cell 12. At this time, $T_2$, backup mode of operation C ensues in memory circuit 10.

At the end of backup mode of operation C at time $T_3$, memory circuit 10 commences to exit from second operational mode. Recall signal RCL is generated in high voltage logic section 18 and communicated, both to the backup memory cell in low leakage current backup memory cell 14. In concert therewith, and as indicated by an arrow λ in FIG. 3, regulator enable signal RGN is also reasserted by high voltage logic section 18. As indicated by an arrow μ, this enables internal LDO power supply regulator 16 to reset the value of internally regulated low voltage $V_{dd}$ from ground state GND to $V_{dd}$ as indicated by the ascending waveform at 28 and, as a consequence, provide power to low voltage main memory cell 12.

It is during the process of increasing the value of internally regulated low voltage $V_{dd}$ that the data state preserved in the backup memory cell in low leakage current backup memory cell 14 throughout the second mode of operation C is loaded back into the flip-flop circuit section 22 in low voltage memory cell 12. When the value of internally regulated low voltage $V_{dd}$ supply reaches a predetermined threshold fraction $V_{dd-T}$ of the full value of internally regulated low voltage $V_{dd}$, then as indicated by an arrow π, recall signal RCL is deserted within a restoration period of about $\Delta T_2 \geq 15.0$ μsec.

In response to the deassertion of recall signal RCL, and as indicated by arrow σ, isolate signal ISO is also taken low to logic 0. Likewise, as indicated by arrow τ in FIG. 3, backup signal BKP is also removed or taken low to logic 0 at a time $T_4$ which marks the end of backup-exit mode of operation D and the resuming of the first mode of operation $A_2$. These events are indicative that the recall process is complete, and as indicated by an arrow φ, system clock signal CLK resumes functional operation in memory circuit 12.

From the foregoing description, it should be further understood that an alternative embodiment is to readout and store all the volatile states of memory circuit 12 rather than one cell section state and store these states in a backup state retention circuit 14 that has a memory for retaining both states for recall by circuit 12. An example of such circuit 14 would be common static RAM circuit.

The foregoing description of the present invention has been provided for purposes of clarity and understanding. That description is not, therefore, intended to limit the present invention to the precise form disclosed. Various modifications to that description are possible without departing from the scope of the present invention or the range of equivalence appropriate thereto.

What is claimed is:

1. A backup state retention circuit comprising:
    a first state retention circuit having a plurality of volatile data states, each state retained in a different circuit section;
    the first state retention circuit operated during a first mode of operation from a first power source;
    a second state retention circuit interconnected to the first state retention circuit through a low impedance path;
    the second state retention circuit operated during a second mode of operation during a second mode of operation from a second power source;
    the power sources for the first and second state retention circuits providing different operating power levels;
    the second state retention circuit having circuit elements connected to the interconnecting path of the first and second state retention circuits that provide high impedance to isolate the circuit power levels from one another.

2. The backup state retention circuit of claim 1 wherein the circuit elements of the second state retention circuit are of lower leakage current than circuit elements in the first state retention circuit.

3. The backup state retention circuit of claim 1 wherein the first state retention circuit is operated on a clock cycle such that other volatile states of the first state retention circuit do not need to be preserved by the second state retention circuit reducing its circuit size and resulting power consumption by the second state retention circuit during the second mode of operation.

4. The backup state retention circuit of claim 1 wherein the interconnecting path is connected between the high impedance circuit elements of the second state retention circuit and the input/output nodes of one of the first state retention circuit sections such that only one data state of the first state retention circuit is connected for retention by the second state retention circuit during the second mode of operation.

5. The backup state retention circuit of claim 1 wherein the operating power level for the second state retention circuit is higher than operating power level for the first state retention circuit.

6. The backup state retention circuit of claim 5 wherein the higher second circuit operating power level permits deployment of high voltage, low leakage current circuit elements.

7. The backup state retention circuit of claim 6 wherein the circuit elements are NMOS transistors.

8. The backup state retention circuit of claim 7 wherein the NMOS transistors have high impedance gates.

9. The backup state retention circuit of claim 1 wherein the second state retention circuit has a longer state retention capability over time compared to the first state retention circuit by employing circuit elements in the former having lower leakage current.

10. The backup state retention circuit of claim 1 wherein the second state retention circuit contains slower operating transistors at a higher operational voltage level provided by the second power source with lower current leakage as compared to the first retention circuit that contains faster operating transistors at a lower operational voltage level provided by the first power source with higher current leakage.

11. The backup state retention circuit of claim 1 wherein the interconnecting path between the first and second circuits comprises a low impedance path to provide for high speed transfer of a volatile state between the first and second state retention circuits.

12. The backup state retention circuit of claim 11 wherein high speed transfer is achieved in the circuit path by absence of any impedance elements in the interconnecting path except for the path impedance itself.

13. The backup state retention circuit of claim 1 wherein the interconnecting path between the first and second state retention circuits is connected only to one state retention circuit section of the first state retention circuit.

14. The backup state retention circuit of claim 13 wherein the one state retention circuit section is a slave flip-flop circuit portion of the first state retention circuit.

15. The backup state retention circuit of claim 1 wherein the second circuit is a flip-flop circuit.

16. A backup state retention circuit for a circuit having at least one volatile state, comprising:
    a first state retention circuit having a plurality of volatile states, each state held by a circuit section in the first state retention circuit during a first mode of operation;
    a second state retention circuit coupled via a circuit path to only one of the circuit sections of the first state retention circuit to receive and store one of the volatile states during a second mode of operation when the first state retention circuit is to be inactivated;
    a clock signal for the first state retention circuit to clock the storing of the one volatile state transfer from the first state retention circuit section to the second state retention circuit and to clock the recall of the stored one volatile state transfer from the second state retention circuit to the first state retention circuit section, the clocking of the storing and recalling accomplished when the clock signal is in the same state;
    the size extent of the second state retention circuit reduced to store and retains only one volatile state of the first state retention circuit section so that less power is consumed by the second state retention circuit during the second mode of operation.

17. The backup state retention circuit of claim 16 wherein the second state retention circuit transfers the stored volatile state back to the first state retention circuit section when the first state retention circuit becomes reactivated.

18. The backup state retention circuit of claim 16 wherein power for the second state retention circuit is higher than power for the first state retention circuit.

19. The backup state retention circuit of claim 16 wherein the second state retention circuit comprises slower operating transistors at a higher operational voltage level as compared to the first state retention circuit that contains faster operating transistors at a lower operational voltage level.

20. The backup state retention circuit of claim 16 wherein the circuit path between the first and second circuits provides for high speed transfer of the one volatile state between the first and second state retention circuits.

21. The backup state retention circuit of claim 16 wherein the second state retention circuit contains slower operating transistors operated at a higher voltage level with circuit state retention transistors having their gates connected, via the circuit path, to the first state retention circuit section to provide for the high speed transfer of the one volatile state between the first and second state retention circuits.

22. The backup state retention circuit of claim 21 wherein second state retention circuit transistor gates have high impedance sufficient to electrically isolate the second state retention circuit higher power level from the first state retention circuit section lower power level.

23. The backup state retention circuit of claim 22 wherein the second state retention circuit transistors are NMOS transistors.

24. The backup state retention circuit of claim 16 wherein the first state retention circuit is a flip flop circuit and the state retention circuit sections comprise a master cell section and a slave cell section.

25. A method of providing state retention backup of a first state retention circuit having a plurality of volatile states respectively held in one of a plurality of circuit sections, comprising the steps of:
 connecting one of the first state retention circuit sections to a second state retention circuit;
 clocking a volatile state for transfer from the first state retention circuit section into the second state retention circuit for storage;
 clocking the stored volatile state for transfer from the second state retention circuit to the first state retention circuit section;
 the clocking steps carried under a clocking condition when both the store and recall transfer are carried out under a same clock state transition so that the other volatile states of the first state retention circuit sections do not need require preservation thereby reducing the size requirements of the second state retention circuit and its corresponding additional power consumption.

26. The method of claim 25 comprising the further step where the same clock state transition in the first state retention circuit is logic zero.

27. The method of claim 25 comprising the further step of fabricating the second state retention circuit with state retention transistors having lower current leakage.

28. The method of claim 25 comprising the further step of providing no high impedance devices in a transfer path between the first state retention circuit section and the second state retention circuit for high speed transfer of the volatile state therebetween.

29. The method of claim 25 wherein the first state retention circuit sections comprise a master cell section and a slave cell section of a flip flop circuit.

30. The method of claim 25 having the further steps of:
 operating the first state retention circuit at a first power level and
 operating the second state retention circuit at a second voltage level.

31. The method of claim 30 comprising the further step of electrically isolating the second state retention circuit from the first state retention circuit.

32. The method of claim 31 wherein the isolation is carried out by the step of providing high impedance gates in storage transistors in the second state retention circuit that are electrically connected to the first state retention circuit section.

33. The method of claim 32 wherein the storage transistors are high voltage NMOS transistors.

34. The method of claim 25 comprising the further steps of:
 providing the second state retention circuit with higher voltage, lower speed transistors as compared to lower voltage, higher speed transistors provided for in the first state retention circuit to achieve low current leakage in the second circuit.

\* \* \* \* \*